US012597897B2

(12) United States Patent
Kazuno et al.

(10) Patent No.: US 12,597,897 B2
(45) Date of Patent: Apr. 7, 2026

(54) DIFFERENTIAL AMPLIFYING APPARATUS

(71) Applicant: Murata Manufacturing Co., Ltd.,
Kyoto (JP)

(72) Inventors: Masafumi Kazuno, Kyoto (JP); Kenji Mukai, Kyoto (JP)

(73) Assignee: Murata Manufacturing Co., Ltd.,
Kyoto (JP)

( * ) Notice: Subject to any disclaimer, the term of this patent is extended or adjusted under 35 U.S.C. 154(b) by 675 days.

(21) Appl. No.: 18/051,665

(22) Filed: Nov. 1, 2022

(65) Prior Publication Data
US 2023/0134242 A1 May 4, 2023

(30) Foreign Application Priority Data
Nov. 2, 2021 (JP) ................................. 2021-179219

(51) Int. Cl.
*H03F 3/45* (2006.01)
*H03F 1/56* (2006.01)

(52) U.S. Cl.
CPC ......... *H03F 3/45475* (2013.01); *H03F 1/565* (2013.01); *H03F 2200/06* (2013.01);
(Continued)

(58) Field of Classification Search
CPC ............. H03F 3/45475; H03F 2200/06; H03F 2200/534; H03F 2200/09; H03F 2200/541;
(Continued)

(56) References Cited

U.S. PATENT DOCUMENTS 3,209,274 A * 9/1965 Spaulding ............... H03J 3/185
330/305
3,440,564 A * 4/1969 Gerardus ................. H03K 3/30
331/109
(Continued)

FOREIGN PATENT DOCUMENTS

CN      106253864 A * 12/2016 ............. H03F 3/245
CN      110350875 A * 10/2019 ........... H03F 3/4508
(Continued)

OTHER PUBLICATIONS

Zhou et al., A 273.5-312-GHz Signal Source With 2.3 dBm Peak Output Power in a 130-nm SiGe BiCMOS Process, May 2020, IEEE Transactions on Terahertz Science and Technology, vol. 10, No. 3 (Year: 2020).*

*Primary Examiner* — Andrea Lindgren Baltzell
*Assistant Examiner* — Lance Torbjorn Bartol
(74) *Attorney, Agent, or Firm* — McDonald Hopkins LLC

(57) ABSTRACT

A differential amplifying apparatus includes an input matching circuit serving as an input balun to which a signal inputted to an input terminal is input, an output matching circuit serving as an output balun that outputs a signal to an output terminal, first and second amplifiers provided in parallel between the input balun and the output balun and configured to output a differential signal, a diode provided between a reference potential and a path between the input balun and the first amplifier, a second diode provided between a reference potential and a path between the input balun and the second amplifier, and a bias circuit that applies a bias to the first diode and the second diode, in which a cathode of the first diode and a cathode of the second diode are connected to the reference potential side.

8 Claims, 8 Drawing Sheets

(52) U.S. Cl.
CPC .... *H03F 2200/09* (2013.01); *H03F 2200/451* (2013.01); *H03F 2200/534* (2013.01); *H03F 2200/537* (2013.01); *H03F 2200/541* (2013.01); *H03F 2203/45142* (2013.01); *H03F 2203/45568* (2013.01)

(58) Field of Classification Search
CPC ......... H03F 2200/451; H03F 2200/537; H03F 2203/45142; H03F 2203/45568; H03F 1/565
USPC ........................................................ 330/261
See application file for complete search history.

(56) References Cited

U.S. PATENT DOCUMENTS

| | | | | |
|---|---|---|---|---|
| 2011/0150243 | A1* | 6/2011 | Onishi | H03F 3/187 |
| | | | | 327/536 |
| 2014/0035673 | A1* | 2/2014 | Ortiz | H03F 3/45076 |
| | | | | 330/261 |
| 2014/0227988 | A1 | 8/2014 | Sato et al. | |
| 2017/0222615 | A1* | 8/2017 | Gobbi | H03F 3/45098 |

FOREIGN PATENT DOCUMENTS

| | | | |
|---|---|---|---|
| CN | 112398448 | A | 8/2021 |
| CN | 213957246 | U * | 8/2021 |
| JP | 2014-155171 | A | 8/2014 |

* cited by examiner

DIFFERENTIAL AMPLIFYING APPARATUS

CROSS REFERENCE TO RELATED APPLICATION

This application claims priority from Japanese Patent Application No. 2021-179219 filed on Nov. 2, 2021. The content of this application is incorporated herein by reference in its entirety.

BACKGROUND OF THE DISCLOSURE

1. Field of the Disclosure

The present disclosure relates to a differential amplifying apparatus.

2. Description of the Related Art

A differential amplifying apparatus used as a power amplifying apparatus for wireless communication or the like has been known (for example, Japanese Unexamined Patent Application Publication No. 2014-155171). The differential amplifying apparatus disclosed in Japanese Unexamined Patent Application Publication No. 2014-155171 includes an amplifier circuit for a low power mode (hereinafter referred to as LPM) and an amplifier circuit for a high power mode (hereinafter referred to as HPM). The amplifier circuit for LPM and the amplifier circuit for HPM are switched and used according to the power mode.

However, according to Japanese Unexamined Patent Application Publication No. 2014-155171, the amplifier circuit for LPM is required in addition to the amplifier circuit for HPM, and it is difficult to reduce the size of the differential amplifying apparatus.

BRIEF SUMMARY OF THE DISCLOSURE

The present disclosure has been made in view of the above, and it is a possible benefit of the present disclosure to provide a differential amplifying apparatus capable of switching power modes and realizing miniaturization of the apparatus.

According to an aspect of the present disclosure, in order to solve above-described problems and achieve the possible benefit, there is provided a differential amplifying apparatus including: an input terminal; an input balun to which a signal inputted to the input terminal is input; an output terminal; an output balun that outputs a signal to the output terminal; first and second amplifiers provided in parallel between the input balun and the output balun and configured to output a differential signal; a first diode provided between a reference potential and a path between the input balun and the first amplifier; a second diode provided between a reference potential and a path between the input balun and the second amplifier; and a bias circuit that applies a bias to the first diode and the second diode, in which a cathode of the first diode and a cathode of the second diode are connected to the reference potential.

According to the present disclosure, it is possible to realize miniaturization of a differential amplifying apparatus.

DETAILED DESCRIPTION OF THE DISCLOSURE

Figure 1:
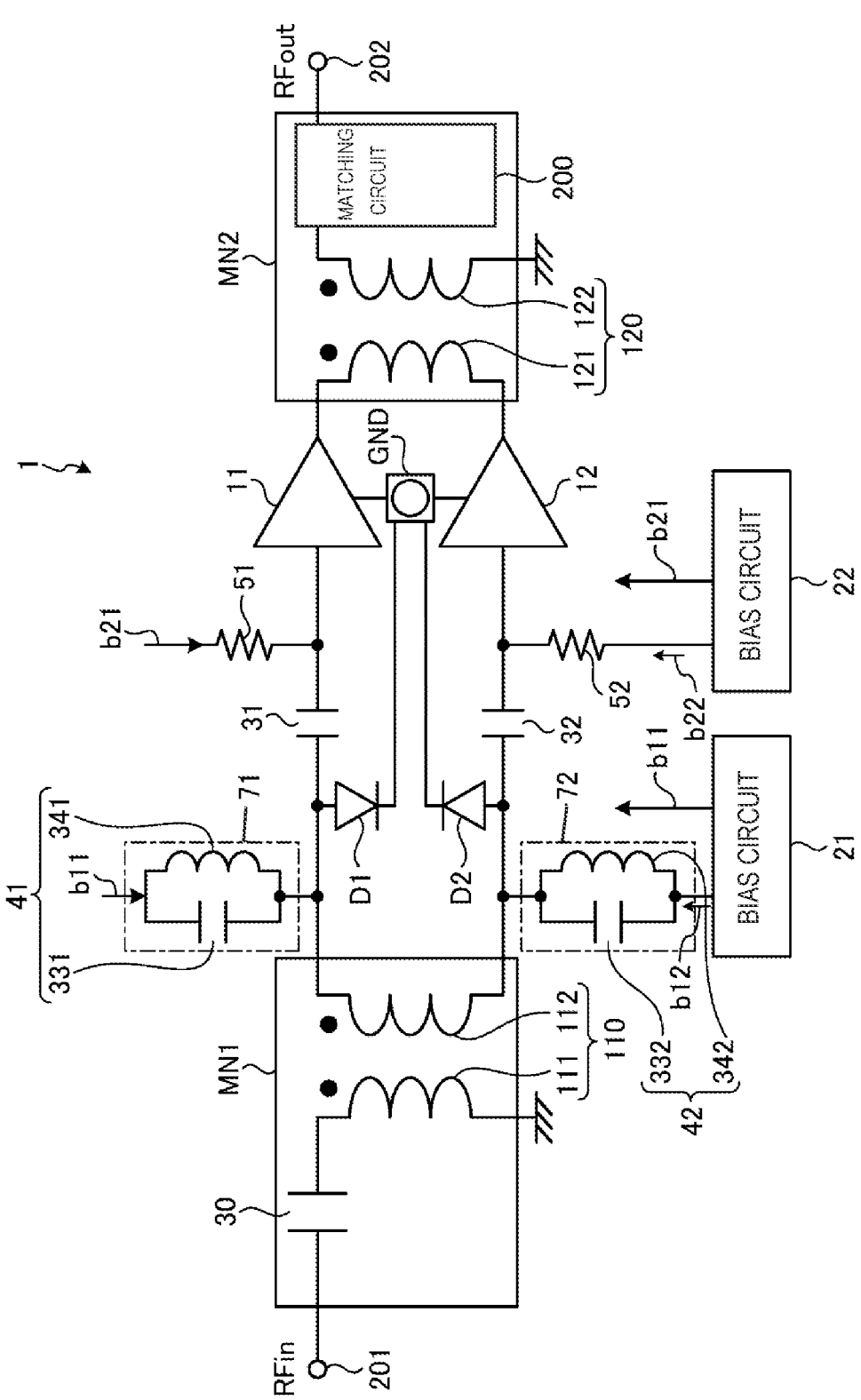
FIG. 1 is a diagram illustrating an example of a differential amplifying apparatus according to a first embodiment of the present disclosure.

Hereinafter, embodiments of the present disclosure will be described in detail with reference to the accompanying drawings. In the following description of each embodiment, the same reference numerals are given to the same or equivalent components as those in other embodiments, and the description thereof will be simplified or omitted. The present disclosure is not limited to the embodiments. The constituent elements of each of the embodiments include those that can be easily replaced by a person skilled in the art or those that are substantially the same. Note that the configurations described below can be combined as appropriate. In addition, the configuration can be omitted, replaced, or changed without departing from the gist of the disclosure.

First Embodiment

Configuration

FIG. 1 is a diagram illustrating an example of a differential amplifying apparatus according to a first embodiment of the present disclosure. A differential amplifying apparatus 1 illustrated in FIG. 1 includes an input terminal 201, an input matching circuit MN1, an amplifier 11 serving as a first amplifier and an amplifier 12 serving as a second amplifier that form a differential amplifier circuit, an output matching circuit MN2, and an output terminal 202. The input matching circuit MN1 includes a capacitor 30, an inductor 111, and an inductor 112. The output matching circuit MN2 includes an inductor 121, an inductor 122, and a matching circuit 200.

One end of the capacitor 30 is connected to the input terminal 201. The other end of the capacitor 30 is connected to one end of the inductor 111. The capacitor 30 is a capacitor for cutting a direct current. The other end of the inductor 111 is connected to a reference potential. The reference potential is exemplified by a ground potential, but the present disclosure is not limited thereto. The same applies to the following description. Note that although the capacitor 30 is provided on the side of the amplifiers 11 and 12 with respect to the input terminal 201, the present disclosure is not limited thereto. For example, the capacitor 30 may be provided on the side opposite to the amplifiers 11 and 12 with respect to the input terminal 201.

The inductor 111 is electromagnetic field coupled to the inductor 112 to form a transformer 110. Here, one end of the inductor 111 is connected to the input terminal 201, and the other end thereof is connected to the reference potential. In addition, one end of the inductor 112 is connected to the input of the amplifier 11, and the other end of the inductor 112 is connected to the input of the amplifier 12. The transformer 110 operates as an input balun that performs unbalanced-to-balanced conversion for a signal of the inductor 111 serving as a primary winding. The signal inputted to the inductor 111 is converted by the transformer 110 to generate a differential signal in the inductor 112. The electromagnetic field coupling is defined as either or both of magnetic field coupling and electric field coupling.

The output of the input matching circuit MN1 is connected to one end of a capacitor 31 and one end of a capacitor 32. The other end of the capacitor 31 is connected to the input of the amplifier 11. The capacitor 31 is a capacitor for cutting a direct current. The other end of capacitor 32 is connected to the input of the amplifier 12. The output of the amplifier 11 is connected to one end of the inductor 121. The output of the amplifier 12 is connected to the other end of the inductor 121. The capacitor 32 is a capacitor for cutting a direct current.

The inductor 121 is electromagnetic field coupled to the inductor 122 to form a transformer 120. One end of the inductor 122 is connected to the input of the matching circuit 200. The other end of the inductor 122 is connected to a reference potential. The transformer 120 operates as an output balun that performs balanced-to-unbalanced conversion. The output of the matching circuit 200 is connected to the output terminal 202.

Figure 2:
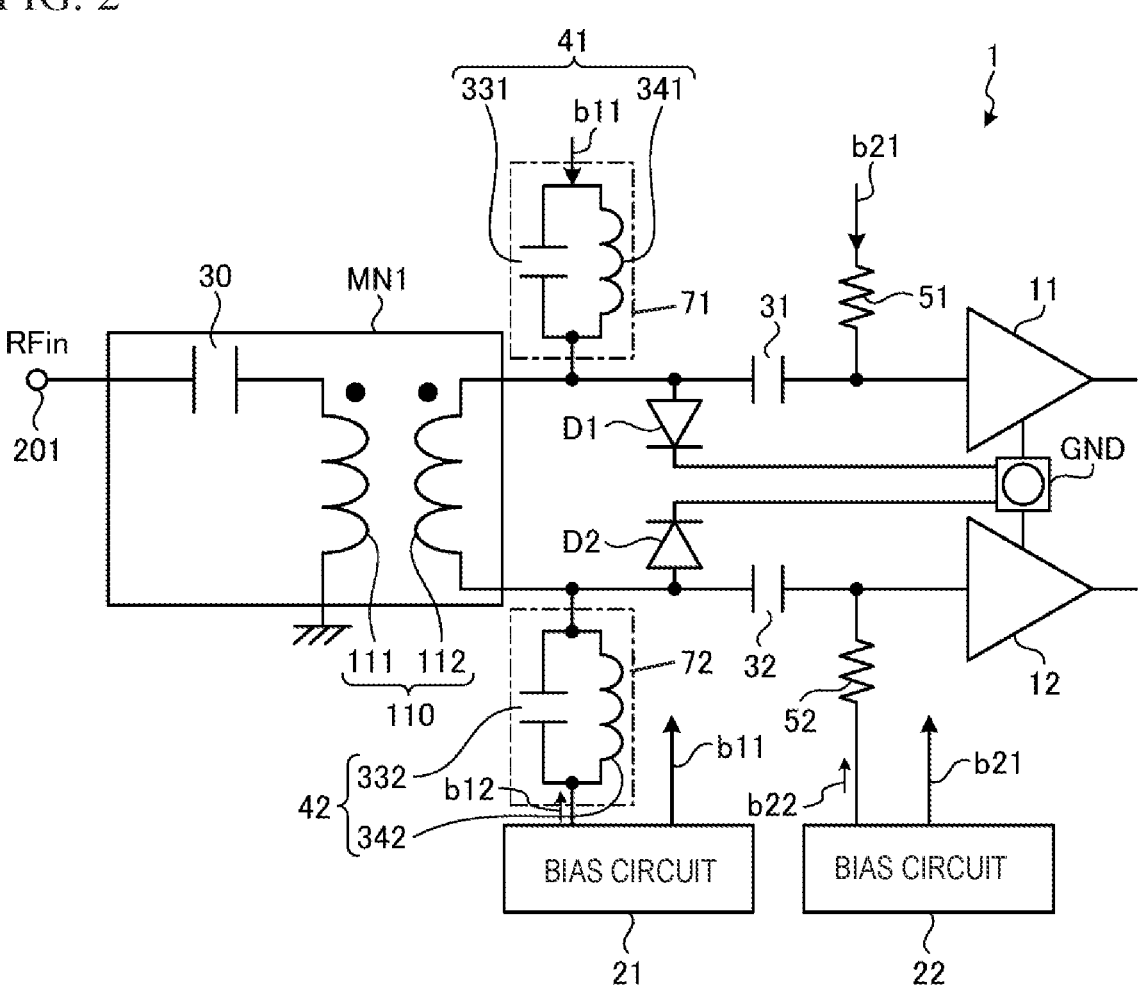
FIG. 2 is a diagram focusing on an input matching circuit, an amplifier, and the like according to the first embodiment of the present disclosure.

FIG. 2 is a diagram focusing on the input matching circuit MN1, the amplifiers 11 and 12, and the like according to the first embodiment of the present disclosure. As illustrated in FIG. 2, a diode D1 serving as a first diode is provided in a path between the transformer 110 serving as an input balun and the amplifier 11. The diode D1 is connected between one end of the inductor 112 and a reference potential GND. The cathode of the diode D1 is connected to the reference potential GND. In addition, a diode D2 serving as a second diode is provided in a path between the transformer 110 serving as the input balun and the amplifier 12. The diode D2 is connected between the other end of the inductor 112 and the reference potential GND. The cathode of the diode D2 is connected to the reference potential GND. The diodes D1 and D2 are connected in parallel to the amplifiers 11 and 12. Note that the reference potential GND is a reference potential of the amplifiers 11 and 12.

A bias b11 outputted from a bias circuit 21 is applied to the anode of the diode D1. The bias b11 outputted from the bias circuit 21 is applied via a bias line 71. The bias line 71 is connected to a secondary winding of the transformer 110 serving as the input balun. A parallel resonance circuit 41 is connected to the bias line 71. The parallel resonance circuit 41 includes a capacitor 331 and an inductor 341 connected in parallel with each other. Note that two diodes D1 may be provided to form a two-stage configuration. However, from the viewpoint of reducing the size of the apparatus, it is desirable to use only one diode D1 (that is, a one-stage configuration). The bias b11 may be a voltage for turning on one diode D1.

A bias b12 outputted from the bias circuit 21 is applied to the anode of the diode D2. The bias b12 outputted from the bias circuit 21 is applied via a bias line 72. The bias line 72 is connected to the secondary winding of the transformer 110 serving as the input balun. A parallel resonance circuit

42 is connected to the bias line 72. The parallel resonance circuit 42 includes a capacitor 332 and an inductor 342 connected in parallel with each other. Note that two diodes D2 may be provided to form a two-stage configuration. However, from the viewpoint of reducing the size of the apparatus, it is desirable to use only one diode D2 (that is, a one-stage configuration). The bias b12 may be a voltage for turning on one diode D2.

A bias b21 outputted from a bias circuit 22 is applied to the input of the amplifier 11. The bias b21 outputted from the bias circuit 22 is applied to the input of the amplifier 11 via a resistance element 51. Thus, a bias is applied to the transistor in the amplifier 11. A bias b22 outputted from a bias circuit 22 is applied to the input of the amplifier 12. The bias b22 outputted from the bias circuit 22 is applied to the input of the amplifier 12 via a resistance element 52. Thus, a bias is applied to the transistor in the amplifier 12.

Operation

A signal inputted to the input terminal 201, for example, an input signal RFin of a radio frequency (RF) is divided into two signals having phases different from each other by approximately 180° via the transformer 110, and then inputted to the amplifiers 11 and 12. The two signals amplified by the amplifiers 11 and 12 are combined via the output matching circuit MN2 and outputted to the output terminal 202 as an output signal RFout.

Here, the gain of the differential amplifying apparatus 1 can be adjusted by turning on or off the diode D1 connected to the input side of the amplifier 11 and the diode D2 connected to the input side of the amplifier 12.

To be specific, by turning on the diodes D1 and D2 by the biases b11 and b12 applied from the bias circuit 21, a part of the input signal flows to the reference potential GND through the diodes D1 and D2. As a result, the gain can be reduced and the LPM can be realized.

On the other hand, the diodes D1 and D2 are turned off by the biases b11 and b12 applied from the bias circuit 21. At this time, the parallel resonance circuits 41 and 42 are adjusted so as to be open (i.e., having infinite impedance) at an operating frequency. Therefore, the gain is not affected. Thus, the HPM can be realized without reducing the gain.

As described above, the LPM can be realized by turning on the diodes D1 and D2 and the HPM can be realized by turning off the diodes D1 and D2 by the applied bias.

When a diode is connected to a preceding stage (specifically, between the input terminal 201 and the transformer 110) of the transformer 110 serving as the input balun, since the impedance of the preceding stage of the transformer 110 is relatively high and the voltage amplitude of a signal becomes large, there is a possibility that the diode is turned on unintentionally. On the other hand, as in the first embodiment, by connecting the diodes D1 and D2 to a subsequent stage of the transformer 110 serving as the input balun (specifically, between the transformer 110 and the amplifiers 11 and 12), the input voltage amplitude of the signal can be reduced by using the fact that the impedance of the subsequent stage of the transformer 110 is lower than the impedance of the preceding stage of the transformer 110, and the diode can be prevented from being turned on unintentionally.

As described above, by adding a diode and turning on or off the diode by the applied bias, the LPM and HPM can be realized without providing a configuration dedicated to the LPM. Therefore, it is possible to realize miniaturization of the differential amplifying apparatus.

Second Embodiment

Configuration

Figure 3:
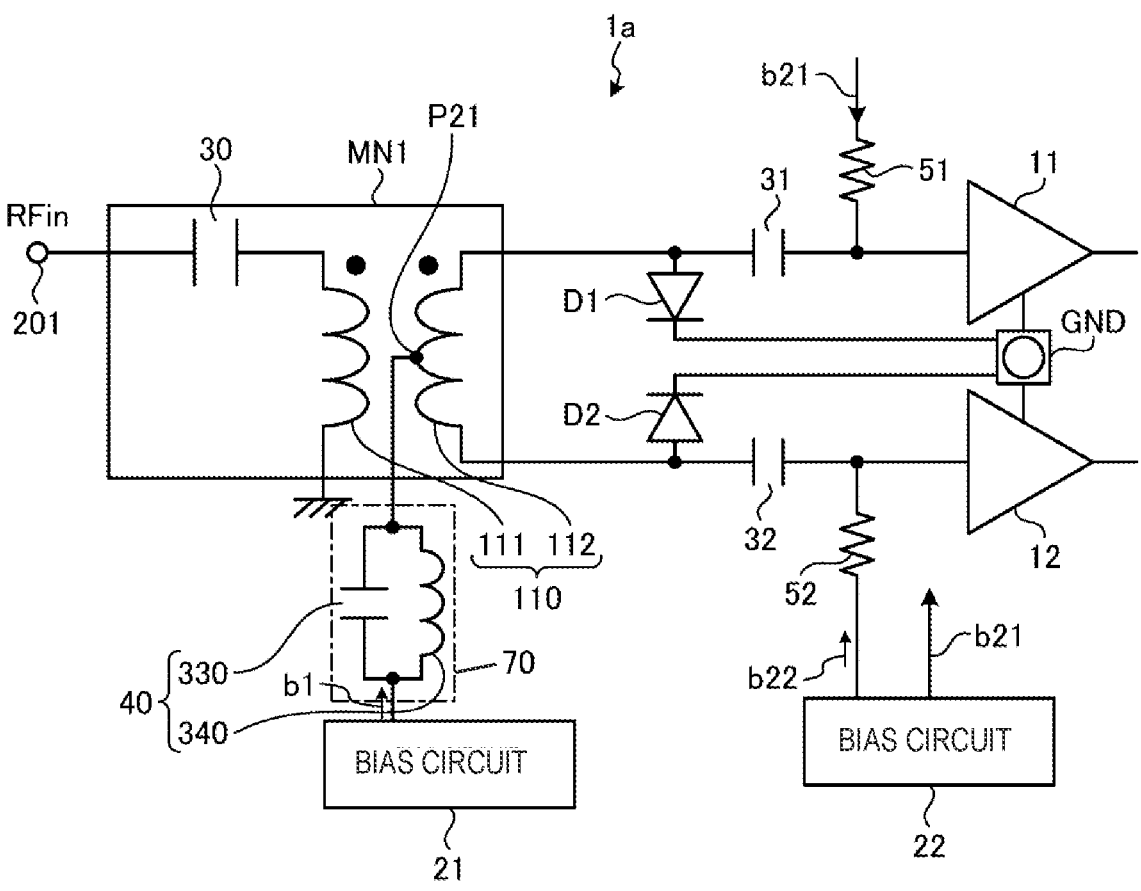
FIG. 3 is a diagram illustrating an example of a differential amplifying apparatus according to a second embodiment of the present disclosure.

FIG. 3 is a diagram illustrating an example of a differential amplifying apparatus 1a according to a second embodiment of the present disclosure. FIG. 3 is a diagram focusing on the input matching circuit MN1, the amplifiers 11 and 12, and the like according to the second embodiment. Also in the second embodiment, the diodes D1 and D2 are connected to the subsequent stage of the transformer 110 serving as the input balun.

As illustrated in FIG. 3, in the second embodiment, unlike the first embodiment, the bias line 70 is connected to a midpoint P21 of the inductor 112 serving as the secondary winding of the input balun. The midpoint P21 is a virtual ground point of the high frequency signal. The midpoint in the present disclosure does not mean a position at which the inductance value of the secondary winding of the transformer is half, but is defined as a half of the primary winding within a range of manufacturing variation of the secondary winding of the transformer. Note that the bias line 70 may be connected to any portion of the inductor 112 and does not necessarily need to be connected to the midpoint P21 of the inductor 112.

The midpoint P21 of the secondary winding of the transformer 110 is connected to the bias circuit 21 via a parallel resonance circuit 40. The parallel resonance circuit 40 includes a capacitor 330 and an inductor 340 connected in parallel with each other. The parallel resonance circuit 40 is adjusted so as to be open (i.e., having infinite impedance) at the operating frequency.

Operation

In FIG. 3, a bias is applied to the diodes D1 and D2 via the parallel resonance circuit 40. Similar to the differential amplifying apparatus according to the first embodiment described with reference to FIG. 2, the LPM can be realized by turning on the diodes D1 and D2 and the HPM can be realized by turning off the diodes D1 and D2 by the applied bias. In particular, by connecting the diodes D1 and D2 to the subsequent stage of the transformer 110 serving as the input balun, the input voltage amplitude can be reduced due to low impedance.

As described above, the LPM can be realized by turning on the diodes D1 and D2 and the HPM can be realized by turning off the diodes D1 and D2 by the applied bias.

As described above, by adding a diode and turning on or off the diode by the applied bias, the LPM and HPM can be realized without providing a configuration dedicated to the LPM. Therefore, it is possible to realize miniaturization of the differential amplifying apparatus.

In addition, in the differential amplifying apparatus according to the first embodiment described with reference to FIG. 2, a parallel resonance circuit is provided for each of the two diodes D1 and D2, whereas in a second embodiment, only one parallel resonance circuit may be provided. Therefore, the circuit scale can be made smaller than that in the first embodiment.

Third Embodiment

Configuration

Figure 4:
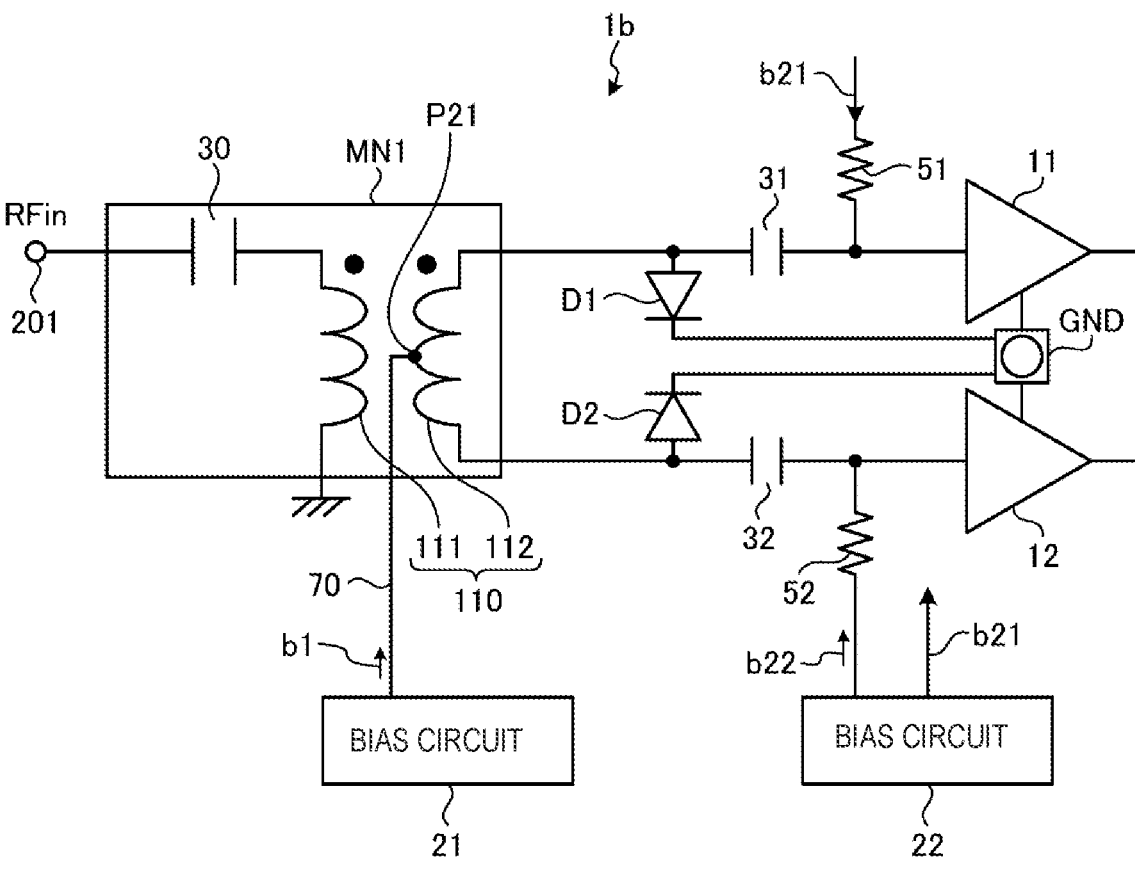
FIG. 4 is a diagram illustrating an example of a differential amplifying apparatus according to a third embodiment of the present disclosure.

FIG. 4 is a diagram illustrating an example of a differential amplifying apparatus 1b according to a third embodiment of the present disclosure. FIG. 4 is a diagram focusing on the input matching circuit MN1, the amplifiers 11 and 12, and the like according to the third embodiment. As illustrated in FIG. 4, also in the third embodiment, the diodes D1 and D2 are connected to the subsequent stage of the transformer 110 serving as the input balun. As in the second embodiment, the bias line 70 is connected to the midpoint P21 of the inductor 112.

In the differential amplifying apparatus according to the second embodiment described with reference to FIG. 2, a bias is applied via the parallel resonance circuit 40. On the other hand, the differential amplifying apparatus according to the third embodiment does not use a parallel resonance circuit.

Since the midpoint P21 of the inductor 112 serving as the secondary winding of the transformer 110 serving as the input balun becomes a virtual ground point of a high frequency signal, there is no problem in principle even when a parallel resonance circuit is not provided. When the parallel resonance circuit is omitted in this manner, the circuit scale can be further reduced.

Operation

When the diodes D1 and D2 are turned on by a bias b1 applied from the bias circuit 21, a part of the input signal flows to the reference potential GND through the diodes D1 and D2. As a result, the gain can be reduced and the LPM can be realized.

On the other hand, the diodes D1 and D2 are turned off by the bias b1 applied from the bias circuit 21. Thus, a part of the input signal does not flow to the reference potential GND through the diodes D1 and D2, and the HPM can be realized without reducing the gain.

As described above, the LPM can be realized by turning on the diodes D1 and D2 and the HPM can be realized by turning off the diodes D1 and D2 by the applied bias.

As described above, by adding a diode and turning on or off the diode by the applied bias, the LPM and HPM can be realized without providing a configuration dedicated to the LPM. Therefore, it is possible to realize miniaturization of the differential amplifying apparatus.

Fourth Embodiment

Configuration

Figure 5:
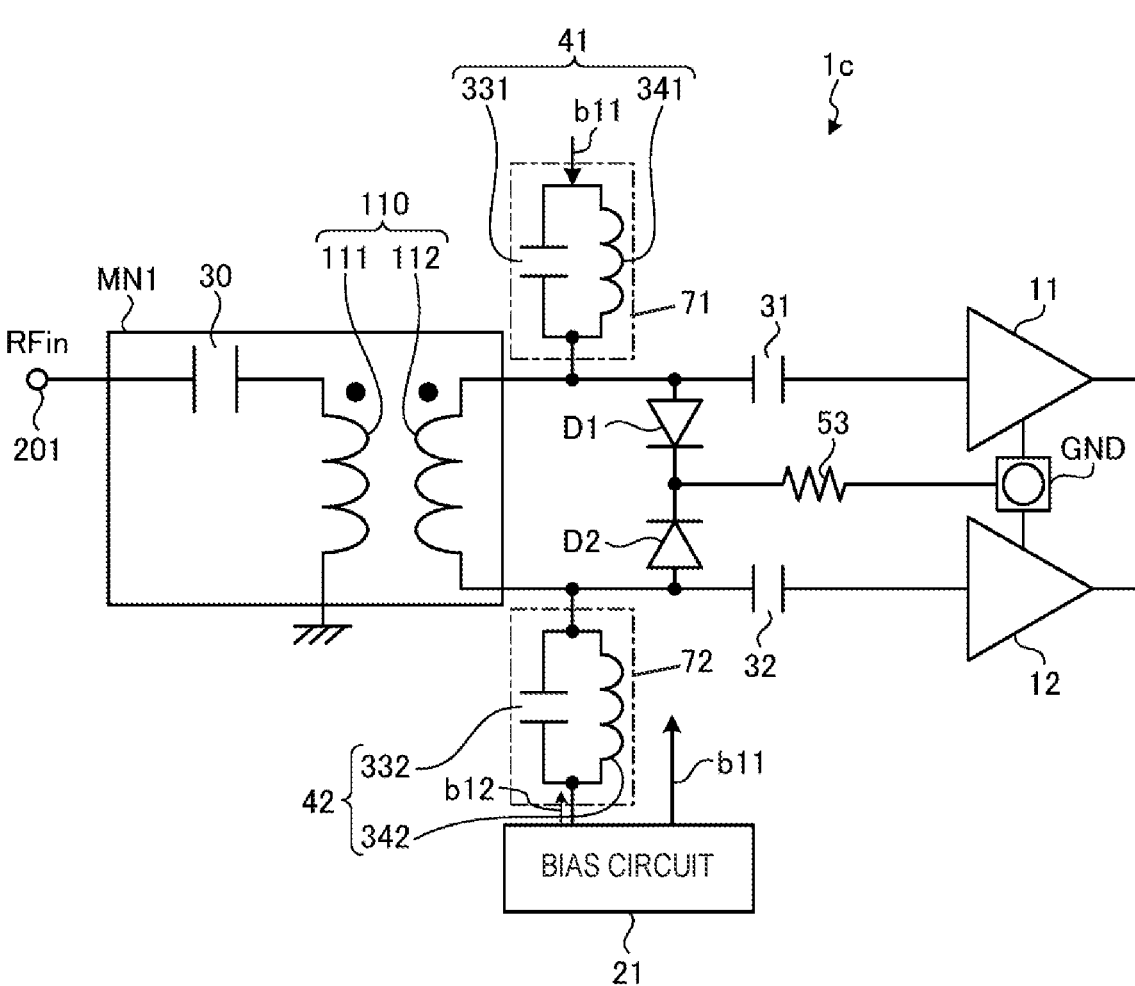
FIG. 5 is a diagram illustrating an example of a differential amplifying apparatus according to a fourth embodiment of the present disclosure.

FIG. 5 is a diagram illustrating an example of a differential amplifying apparatus 1c according to a fourth embodiment of the present disclosure. FIG. 5 is a diagram focusing on the input matching circuit MN1, the amplifiers 11 and 12, and the like according to the fourth embodiment.

In the fourth embodiment illustrated in FIG. 5, the cathodes of the diodes D1 and D2, which are shunt diodes, are connected to each other and connected to the reference potential via a resistance element 53. At this time, when the resistance value of the resistance element 53 is increased to some extent, a secondary distortion inputted to the amplifiers 11 and 12, which are a differential pair, can be reduced. Other configurations of the fourth embodiment illustrated in FIG. 5 are the same as those of the first embodiment described with reference to FIG. 2.

Operation

When the diodes D1 and D2 are turned on by the biases b11 and b12 applied from the bias circuit 21, a part of the input signal flows to the reference potential GND through the diodes D1 and D2. As a result, the gain can be reduced and the LPM can be realized.

On the other hand, the diodes D1 and D2 are turned off by the biases b11 and b12 applied from the bias circuit 21. Thus, a part of the input signal does not flow to the reference potential GND through the diodes D1 and D2, and the HPM can be realized without reducing the gain.

As described above, the LPM can be realized by turning on the diodes D1 and D2 and the HPM can be realized by turning off the diodes D1 and D2 by the applied bias.

As described above, by adding a diode and turning on or off the diode by the applied bias, the LPM and HPM can be realized without providing a configuration dedicated to the LPM. Therefore, it is possible to realize miniaturization of the differential amplifying apparatus.

Fifth Embodiment

Configuration

Figure 6:
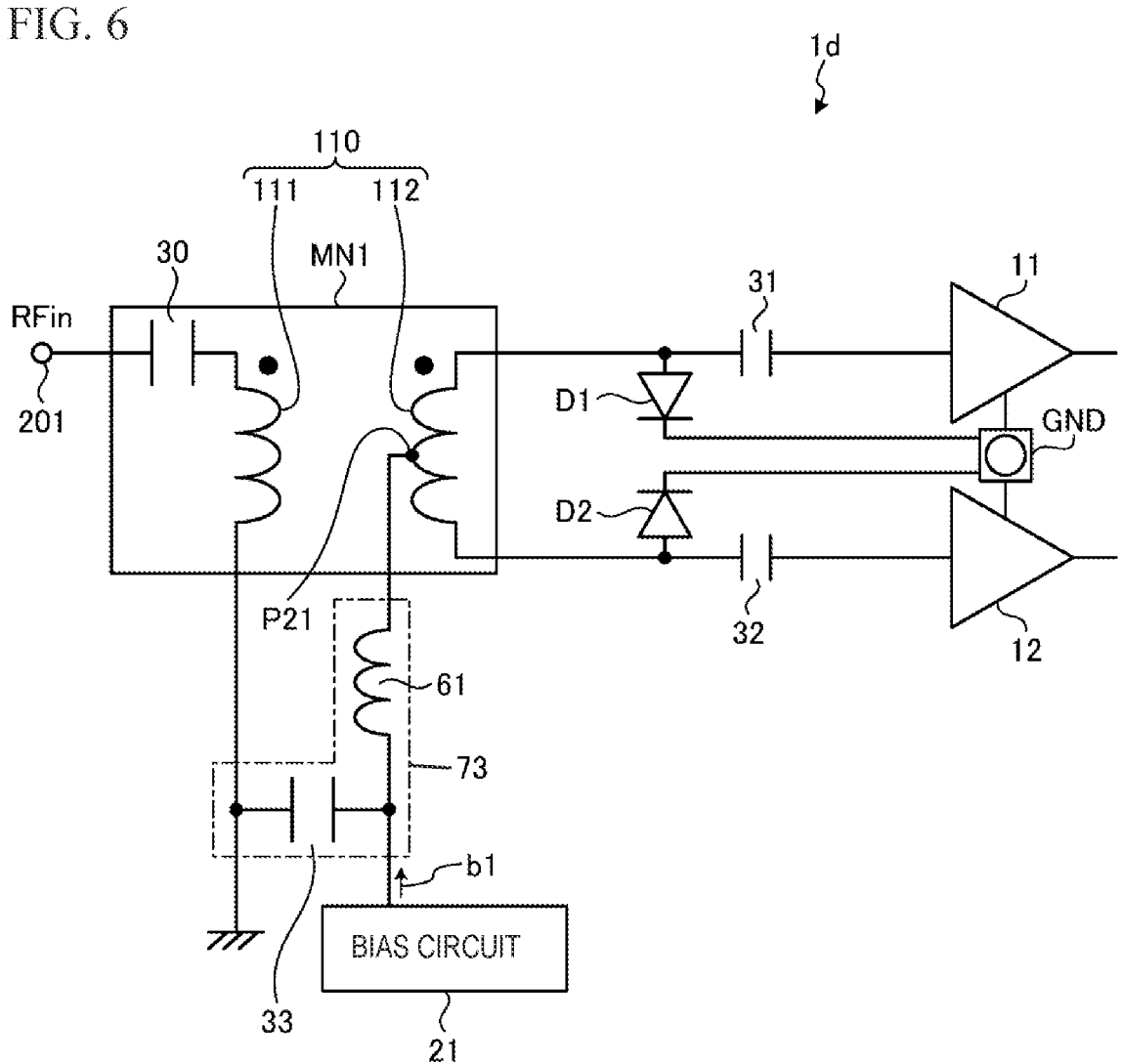
FIG. 6 is a diagram illustrating an example of a differential amplifying apparatus according to a fifth embodiment of the present disclosure.

FIG. 6 is a diagram illustrating an example of a differential amplifying apparatus 1d according to a fifth embodiment of the present disclosure. FIG. 6 is a diagram focusing on the input matching circuit MN1, the amplifiers 11 and 12, and the like according to the fifth embodiment. Also in the fifth embodiment, the diodes D1 and D2 are connected to the subsequent stage of the transformer 110 serving as the input balun.

In the fifth embodiment illustrated in FIG. 6, a bias line 73 is connected to the midpoint P21 of the inductor 112. The midpoint P21 is a virtual ground point of the high frequency signal. The bias line 73 is provided with a series resonance circuit including an inductor 61 and a capacitor 33. One end of the inductor 61 and one end of the capacitor 33 are connected in series. The other end of the inductor 61 is connected to the midpoint of the inductor 112 serving as the secondary winding of the transformer 110. The other end of the capacitor 33 is connected to the inductor 111 serving as the primary winding and the reference potential. The bias b1 is applied to a connection point between the inductor 61 and the capacitor 33. Note that the inductor 61 may be replaced with a signal line.

Operation

When the diodes D1 and D2 are turned on by the bias b1 applied from the bias circuit 21, a part of the input signal flows to the reference potential GND through the diodes D1 and D2. As a result, the gain can be reduced and the LPM can be realized.

On the other hand, the diodes D1 and D2 are turned off by the bias b1 applied from the bias circuit 21. Thus, a part of the input signal does not flow to the reference potential GND through the diodes D1 and D2, and the HPM can be realized without reducing the gain.

As described above, the LPM can be realized by turning on the diodes D1 and D2 and the HPM can be realized by turning off the diodes D1 and D2 by the applied bias.

In addition, the midpoint of the secondary winding of the input matching circuit MN1 and the reference potential of the primary winding are connected via the series resonance circuit. By matching the resonant frequency of the series resonance circuit with the frequency to be removed, for example, a second harmonic component having a frequency twice as high as the fundamental frequency can be removed.

As described above, by adding a diode and turning on or off the diode by the applied bias, the LPM and HPM can be realized without providing a configuration dedicated to the LPM. Therefore, it is possible to realize miniaturization of the differential amplifying apparatus.

Sixth Embodiment

Configuration

Figure 7:
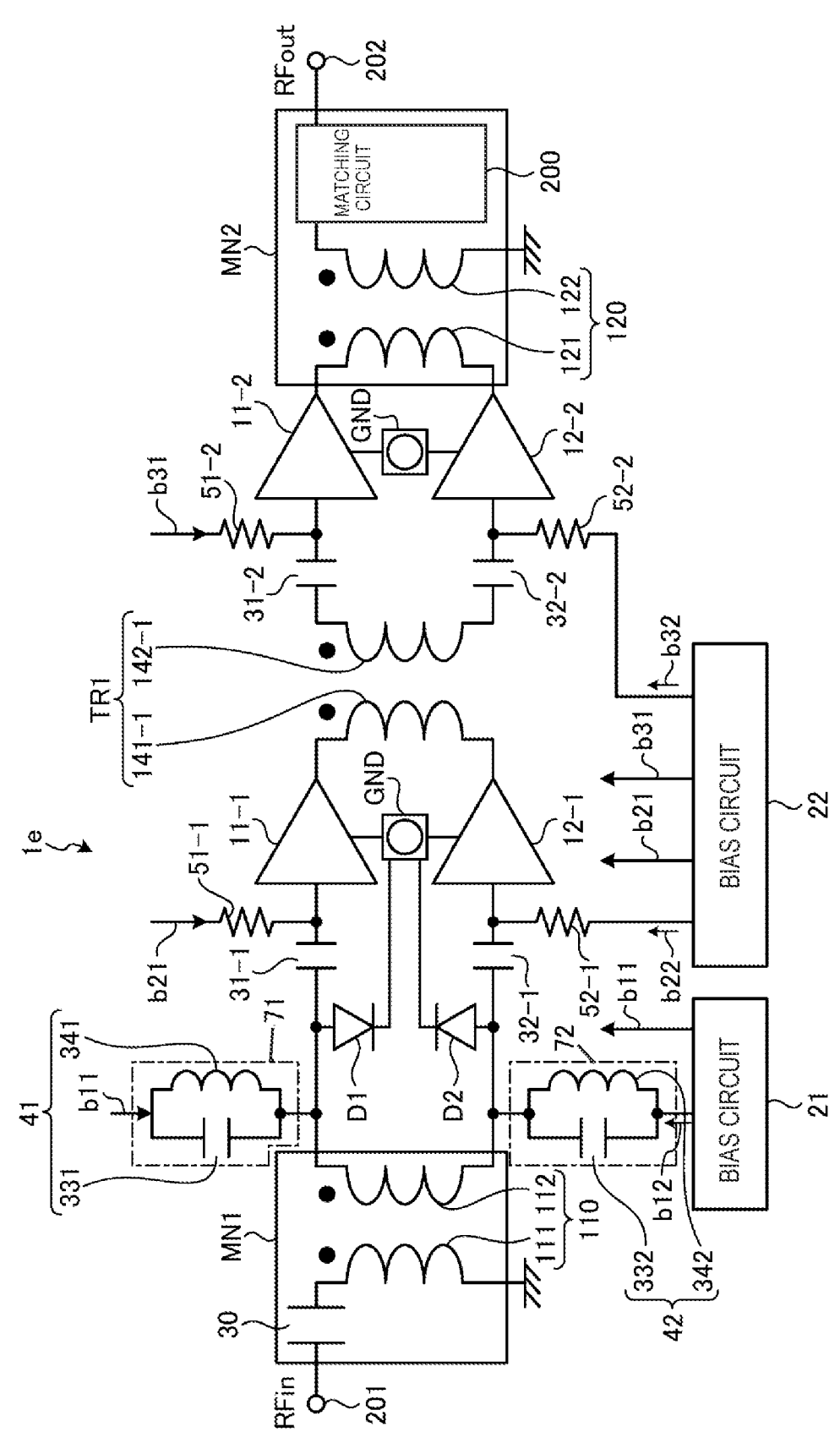
FIG. 7 is a diagram illustrating an example of a differential amplifying apparatus according to a sixth embodiment of the present disclosure.

FIG. 7 is a diagram illustrating an example of a differential amplifying apparatus 1e according to a sixth embodiment of the present disclosure. FIG. 7 illustrates an example of a configuration including two stages of amplifiers between the input matching circuit MN1 and the output matching circuit MN2 of the first embodiment. The two-stage amplifiers are in cascading connection via electromagnetic field coupling by a transformer so that the output of the preceding stage becomes the input of the subsequent stage.

As illustrated in FIG. 7, the differential amplifying apparatus 1e according to the sixth embodiment includes a transformer TR1 in the subsequent stage of amplifiers 11-1 and 12-1. In addition, the differential amplifying apparatus 1e according to the sixth embodiment includes amplifiers 11-2 and 12-2 in the subsequent stage of the transformer TR1. Further, the differential amplifying apparatus 1e according to the sixth embodiment includes the output matching circuit MN2 in the subsequent stage of the amplifiers 11-2 and 12-2. The transformer TR1 includes an inductor 141-1 serving as the primary winding and an inductor 142-1 serving as the secondary winding.

The differential amplifying apparatus 1e according to the sixth embodiment includes capacitors 31-1 and 31-2. The capacitors 31-1 and 31-2 correspond to the capacitor 31 in FIG. 2. The differential amplifying apparatus 1e according to the sixth embodiment includes capacitors 32-1 and 32-2. The capacitors 32-1 and 32-2 correspond to the capacitor 32 in FIG. 2.

The differential amplifying apparatus 1e according to the sixth embodiment includes resistance elements 51-1 and 51-2. The resistance elements 51-1 and 51-2 correspond to the resistance element 51 in FIG. 2. The differential amplifying apparatus 1e according to the sixth embodiment includes resistance elements 52-1 and 52-2. The resistance elements 52-1 and 52-2 correspond to the resistance element 52 in FIG. 2.

The differential amplifying apparatus 1e according to the sixth embodiment has the diodes D1 and D2 only in the first stage. The bias b11 outputted from the bias circuit 21 is applied to the anode of the diode D1. The bias b11 outputted from the bias circuit 21 is applied via the bias line 71. The parallel resonance circuit 41 is connected to the bias line 71. The parallel resonance circuit 41 includes the capacitor 331 and the inductor 341.

The bias b12 outputted from the bias circuit 21 is applied to the anode of the diode D2. The bias b12 outputted from the bias circuit 21 is applied via the bias line 72. The parallel resonance circuit 42 is connected to the bias line 72. The parallel resonance circuit 42 includes the capacitor 332 and the inductor 342.

Note that the bias b21 outputted from the bias circuit 22 is applied to the input side of the amplifier 11-1 via the resistance element 51-1. The bias b22 outputted from the bias circuit 22 is applied to the input side of the amplifier 12-1 via the resistance element 52-1. A bias b31 outputted from the bias circuit 22 is applied to the input side of the amplifier 11-2 via the resistance element 51-2. A bias b32 outputted from the bias circuit 22 is applied to the input side of the amplifier 12-2 via the resistance element 52-2.

Operation

The output of the differential amplifier circuit formed by the amplifiers 11-1 and 12-1 is inputted to the differential amplifier circuit formed by the amplifiers 11-2 and 12-2 via the transformer TR1. The output of the differential amplifier circuit formed by the amplifiers 11-2 and 12-2 is outputted to the output terminal 202 via the output matching circuit MN2.

Also in the sixth embodiment, by turning on the diodes D1 and D2 by the biases b11 and b12 applied from the bias circuit 21, a part of the input signal flows to the reference potential GND through the diodes D1 and D2. As a result, the gain can be reduced and the LPM can be realized.

On the other hand, the diodes D1 and D2 are turned off by the biases b11 and b12 applied from the bias circuit 21. At this time, the parallel resonance circuits 41 and 42 are adjusted so as to be open (i.e., having infinite impedance) at an operating frequency. Therefore, the gain is not affected. Thus, the HPM can be realized without reducing the gain.

As described above, the LPM can be realized by turning on the diodes D1 and D2 and the HPM can be realized by turning off the diodes D1 and D2 by the applied bias.

Note that in the seventh embodiment, two stages of amplifiers are provided in the configuration of the first embodiment, but the two stages of amplifiers may be provided in any one of the configurations of the second embodiment, the third embodiment, the fourth embodiment, and the fifth embodiment.

As described above, by adding a diode and turning on or off the diode by the applied bias, the LPM and HPM can be realized without providing a configuration dedicated to the LPM. Therefore, it is possible to realize miniaturization of the differential amplifying apparatus.

Seventh Embodiment

Configuration

Figure 8:
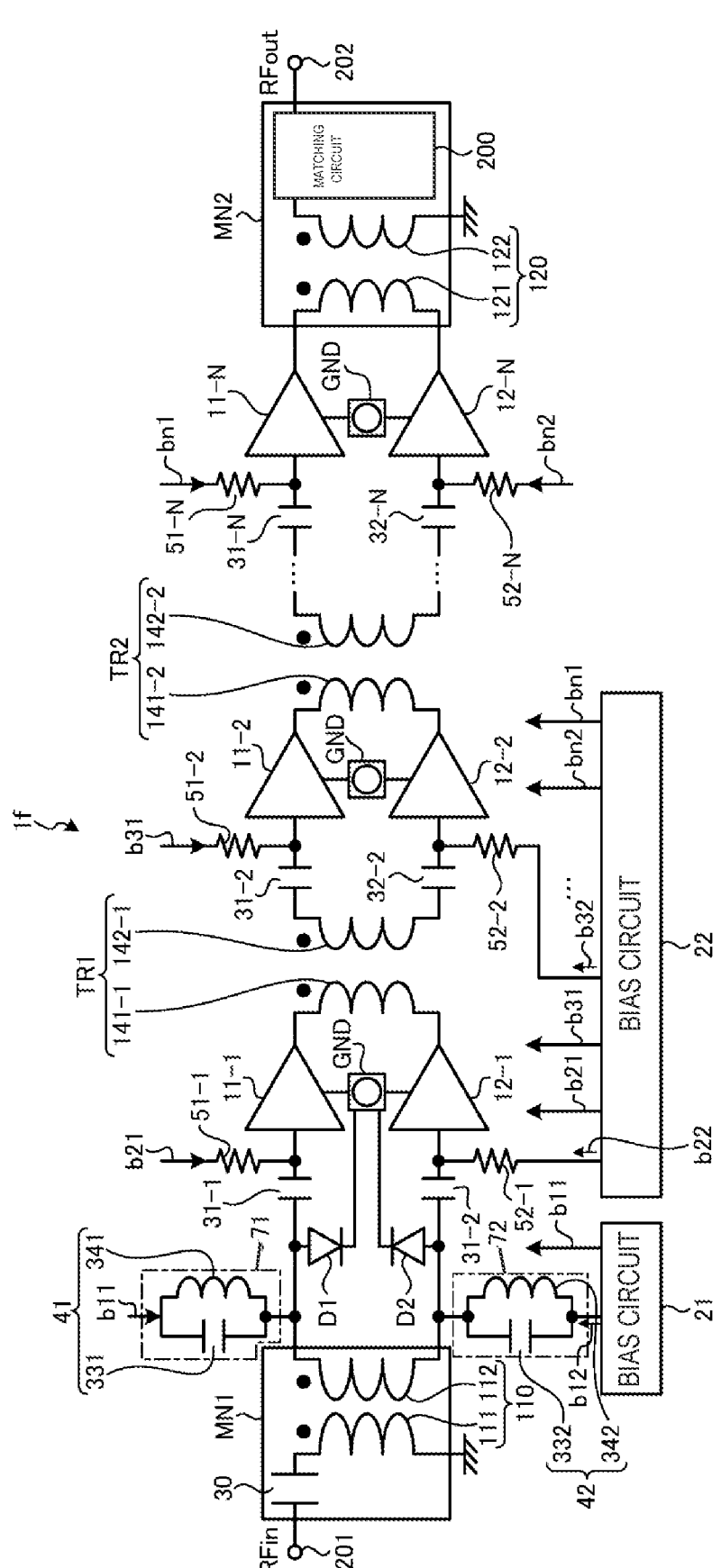
FIG. 8 is a diagram illustrating an example of a differential amplifying apparatus according to a seventh embodiment of the present disclosure.

FIG. 8 is a diagram illustrating an example of a differential amplifying apparatus if according to a seventh embodiment of the present disclosure. FIG. 8 illustrates an example of a configuration including N stages (N is an integer of 2 or more, the same applies hereinafter) of amplifiers between the input matching circuit MN1 and the output matching circuit MN2 of the first embodiment. The N-stage amplifiers are in cascading connection via electromagnetic field coupling by a transformer so that the output of the preceding stage becomes the input of the subsequent stage.

As illustrated in FIG. 8, the differential amplifying apparatus if according to the seventh embodiment includes the transformer TR1 in the subsequent stage of the first stage amplifiers 11-1 and 12-1. In addition, the differential amplifying apparatus if according to the seventh embodiment includes the second stage amplifiers 11-2 and 12-2 in the subsequent stage of the transformer TR1. Further, the differential amplifying apparatus if according to the seventh embodiment includes a transformer TR2 in the subsequent stage of the amplifiers 11-2 and 12-2. Similarly, the differential amplifying apparatus if according to the seventh embodiment includes N-th stage amplifiers 11-N and 12-N in the subsequent stage of the transformer TR2. The differential amplifying apparatus if according to the seventh embodiment includes the output matching circuit MN2 in the subsequent stage of the N-th stage amplifiers 11-N and 12-N. The transformer TR1 includes the inductor 141-1 serving as the primary winding and the inductor 142-1 serving as the secondary winding. The transformer TR2 includes an inductor 141-2 serving as the primary winding and an inductor 142-2 serving as the secondary winding.

The differential amplifying apparatus if according to the seventh embodiment includes capacitors 31-1, 31-2, . . . , and 31-N. The capacitors 31-1, 31-2, . . . , and 31-N correspond to the capacitor 31 in FIG. 2. The differential amplifying apparatus if according to the seventh embodiment includes capacitors 32-1, 32-2, . . . , and 32-N. The capacitors 32-1, 32-2, . . . , and 32-N correspond to the capacitor 32 in FIG. 2.

The differential amplifying apparatus if according to the seventh embodiment includes resistance elements 51-1, 51-2, . . . , and 51-N. The resistance elements 51-1, 51-2, . . . , and 51-N correspond to the resistance element 51 in FIG. 2. The differential amplifying apparatus if according to the seventh embodiment includes resistance elements 52-1, 52-2, . . . , and 52-N. The resistance elements 52-1, 52-2, . . . , and 52-N correspond to the resistance element 52 in FIG. 2.

The differential amplifying apparatus if according to the seventh embodiment has the diodes D1 and D2 only in the first stage. The bias b11 outputted from the bias circuit 21 is applied to the anode of the diode D1. The bias b11 outputted from the bias circuit 21 is applied via the bias line 71. The parallel resonance circuit 41 is connected to the bias line 71. The parallel resonance circuit 41 includes the capacitor 331 and the inductor 341.

The bias b12 outputted from the bias circuit 21 is applied to the anode of the diode D2. The bias b12 outputted from the bias circuit 21 is applied via the bias line 72. The parallel resonance circuit 42 is connected to the bias line 72. The parallel resonance circuit 42 includes the capacitor 332 and the inductor 342.

Note that the bias b21 outputted from the bias circuit 22 is applied to the input side of the amplifier 11-1 via the resistance element 51-1. The bias b22 outputted from the bias circuit 22 is applied to the input side of the amplifier 12-1 via the resistance element 52-1. The bias b31 outputted from the bias circuit 22 is applied to the input side of the amplifier 11-2 via the resistance element 51-2. The bias b32 outputted from the bias circuit 22 is applied to the input side of the amplifier 12-2 via the resistance element 52-2. Similarly, a bias bn1 outputted from the bias circuit 22 is applied to the input side of the amplifier 11-N via the resistance element 51-N. A bias bn2 outputted from the bias circuit 22 is applied to the input side of the amplifier 12-N via the resistance element 52-N.

Operation

The output of the differential amplifier circuit formed by the amplifiers 11-1 and 12-1 is inputted to the differential amplifier circuit formed by the amplifiers 11-2 and 12-2 in the subsequent stage via the transformer TR1. The output of the differential amplifier circuit formed by the amplifiers 11-2 and 12-2 is inputted to the differential amplifier circuit formed by the amplifiers in the subsequent stage via the transformer TR2. Similarly, the output is sequentially inputted to the differential amplifier circuit formed by the amplifiers in the subsequent stage. The output of the differential amplifier circuit formed by the amplifiers 11-N and 12-N in the N-th stage, which is the final stage, is outputted to the output terminal 202 via the output matching circuit MN2.

Also in the seventh embodiment, by turning on the diodes D1 and D2 by the biases b11 and b12 applied from the bias circuit 21, a part of the input signal flows to the reference potential GND through the diodes D1 and D2. As a result, the gain can be reduced and the LPM can be realized.

On the other hand, the diodes D1 and D2 are turned off by the biases b11 and b12 applied from the bias circuit 21. At this time, the parallel resonance circuits 41 and 42 are adjusted so as to be open (i.e., having infinite impedance) at the operating frequency. Therefore, the gain is not affected. Thus, the HPM can be realized without reducing the gain.

As described above, the LPM can be realized by turning on the diodes D1 and D2 and the HPM can be realized by turning off the diodes D1 and D2 by the applied bias.

Note that in the seventh embodiment, N stages of amplifiers are provided in the configuration of the first embodiment, but the N stages of amplifiers may be provided in any one of the configurations of the second embodiment, the third embodiment, the fourth embodiment, and the fifth embodiment.

As described above, by adding a diode and turning on or off the diode by the applied bias, the LPM and HPM can be realized without providing a configuration dedicated to the LPM. Therefore, it is possible to realize miniaturization of the differential amplifying apparatus.

What is claimed is:

1. A differential amplifying apparatus comprising:
an input terminal;
an input balun to which a signal input to the input terminal is input;
an output terminal;
an output balun configured to output a signal to the output terminal;
first and second amplifiers connected in parallel with each other between the input balun and the output balun, the first and second amplifiers being configured to output a differential signal;
a first diode between a reference potential and a first path connecting the input balun to the first amplifier, and configured to allow current to flow from the first path to ground;
a second diode between the reference potential and a second path connecting the input balun to the second amplifier, and configured to allow current to flow from the second path to ground; and
a bias circuit configured to apply a bias to the first diode and to the second diode,
wherein a cathode of the first diode and a cathode of the second diode are connected to the reference potential, and
wherein the input balun comprises a transformer with a primary winding and a secondary winding.

2. The differential amplifying apparatus according to claim 1, further comprising:
at least one parallel resonance circuit connected between the first diode and the bias circuit, and/or connected between the second diode and the bias circuit,
wherein the at least one parallel resonance circuit comprises an inductor and a capacitor connected in parallel with each other.

3. The differential amplifying apparatus according to claim 1,
wherein
a bias line configured to apply the bias is connected to the secondary winding of the input balun.

4. The differential amplifying apparatus according to claim 3, wherein the bias line configured to apply the bias is connected to a midpoint of the secondary winding of the input balun.

5. The differential amplifying apparatus according to claim 1, further comprising:
a resistance circuit element connected between the cathode of the first diode and the cathode of the second diode and the reference potential,
wherein the cathode of the first diode and the cathode of the second diode are connected to the reference potential via the resistance circuit element.

6. The differential amplifying apparatus according to claim 4, further comprising a series resonance circuit connected in the bias line,
wherein the series resonance circuit comprises an inductor and a capacitor, and a first end of the inductor and a first end of the capacitor are connected in series,
wherein a second end of the inductor is connected to the midpoint of the secondary winding of the input balun,
wherein a second end of the capacitor is connected to the primary winding and to the reference potential, and
wherein the bias is applied to a node between the inductor and the capacitor.

7. The differential amplifying apparatus according to claim 1, comprising a plurality of stages of the first and second amplifiers,
wherein the first and second amplifiers in the plurality of stages are in cascading connection.

8. The differential amplifying apparatus according to claim 2, wherein the at least one parallel resonance circuit comprises a first parallel resonance circuit connected between the first diode and the bias circuit, and a second parallel resonance circuit connected between the second diode and the bias circuit.

* * * * *